(12) United States Patent
Halliday

(10) Patent No.: US 12,200,894 B2
(45) Date of Patent: Jan. 14, 2025

(54) RACK RAIL SUPPORT

(71) Applicant: Hammond Manufacturing Company Limited, Guelph (CA)

(72) Inventor: Andy Halliday, Fergus (CA)

(73) Assignee: Hammond Manufacturing Company Limited, Guelph (CA)

( * ) Notice: Subject to any disclaimer, the term of this patent is extended or adjusted under 35 U.S.C. 154(b) by 0 days.

(21) Appl. No.: 18/066,143

(22) Filed: Dec. 14, 2022

(65) Prior Publication Data

US 2023/0189467 A1 Jun. 15, 2023

Related U.S. Application Data

(60) Provisional application No. 63/289,930, filed on Dec. 15, 2021.

(51) Int. Cl.
*H05K 7/14* (2006.01)
*H05K 7/18* (2006.01)

(52) U.S. Cl.
CPC .......... *H05K 7/1489* (2013.01); *H05K 7/183* (2013.01)

(58) Field of Classification Search
CPC ...... H05K 7/183; H05K 7/1489; A47B 57/40; A47B 57/42; A47B 96/061; A47B 96/068
See application file for complete search history.

(56) References Cited

U.S. PATENT DOCUMENTS

| | | | | |
|---|---|---|---|---|
| 1,657,939 A * | 1/1928 | Rockwell | ............... | F16L 3/221 248/68.1 |
| 1,852,598 A * | 4/1932 | Vogt | ..................... | A47B 57/425 248/222.51 |
| 1,853,018 A * | 4/1932 | Knape | .................. | A47B 57/425 248/243 |
| 1,872,429 A * | 8/1932 | Eaglesfield | ............ | A47B 57/34 248/243 |
| 2,471,839 A * | 5/1949 | Schumacher | ........... | H01B 17/24 248/226.12 |
| 2,667,322 A * | 1/1954 | Ulberg, Jr. | ............. | A47B 57/52 182/189 |
| 3,081,717 A * | 3/1963 | Yurevich | ................ | A47B 57/30 108/107 |
| 3,186,364 A * | 6/1965 | Angelus | ................. | A47B 57/40 312/351 |
| 3,199,822 A * | 8/1965 | Ruhnke | ................. | A47B 96/028 248/250 |
| 4,101,108 A * | 7/1978 | Klein | ...................... | A47B 57/40 248/301 |
| 4,193,649 A * | 3/1980 | Sharon | .................. | A47B 88/407 248/248 |
| 4,382,416 A * | 5/1983 | Kellogg-Smith | ......... | E06C 9/04 114/90 |
| 4,681,289 A * | 7/1987 | Gronlund | ............... | A47B 88/43 248/224.8 |

(Continued)

*Primary Examiner* — Patrick D Hawn
(74) *Attorney, Agent, or Firm* — Shumaker & Sieffert, P.A.

(57) ABSTRACT

A rack rail support that provides an easier way to install shelves and other rack equipment on a rack rail. In accordance with one aspect, the rack rail support comprises a support portion configured to support a portion of rack equipment to be installed on a rack rail, and an engagement portion coupled to a first end of the support portion and configured to be inserted through a first hole in the rack rail and to engage with a first surface of the rack rail.

21 Claims, 6 Drawing Sheets

(56) References Cited

U.S. PATENT DOCUMENTS

| | | | | |
|---|---|---|---|---|
| 4,834,555 A * | 5/1989 | Grass | ............... | A47B 88/43 |
| | | | | 384/22 |
| 5,697,589 A * | 12/1997 | Garfinkle | ............... | G09F 7/22 |
| | | | | 248/223.41 |
| 6,189,248 B1 * | 2/2001 | Nagel | ............... | G09F 3/204 |
| | | | | 40/658 |
| 6,269,906 B1 * | 8/2001 | Dockter | ............... | B60R 3/007 |
| | | | | 248/222.51 |
| 7,111,813 B2 * | 9/2006 | Lin | ............... | A47B 57/42 |
| | | | | 248/250 |
| 8,157,230 B2 * | 4/2012 | Krueger | ............... | A47B 96/068 |
| | | | | 248/222.51 |
| 9,814,156 B2 * | 11/2017 | Wilson | ............... | H05K 7/183 |
| 10,093,449 B2 * | 10/2018 | Han | ............... | A47B 96/068 |
| 10,306,796 B2 * | 5/2019 | Huang | ............... | G06F 1/183 |

* cited by examiner

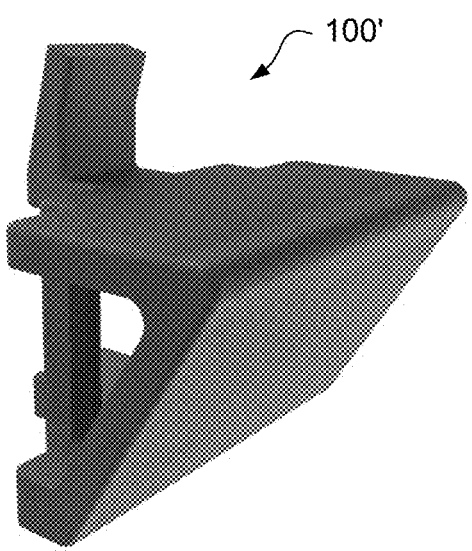
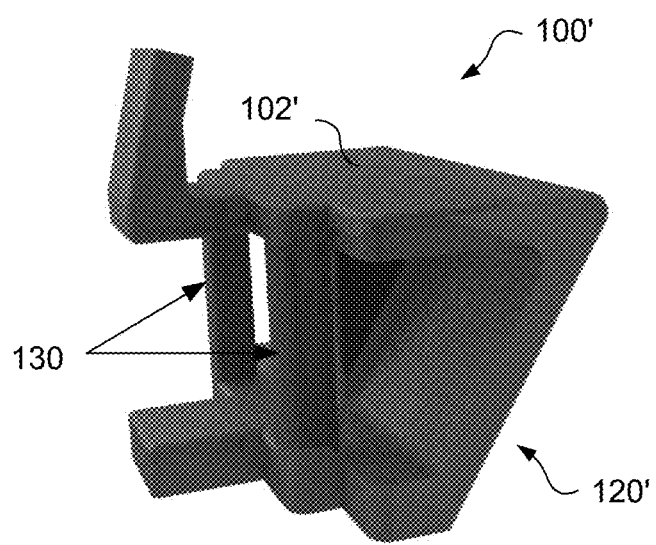
FIG. 1C  FIG. 1D

RACK RAIL SUPPORT

CROSS-REFERENCE TO RELATED APPLICATIONS

This application claims priority to U.S. Provisional Application No. 63/289,930, the entire contents of which is incorporated by reference herein for all purposes.

TECHNICAL FIELD

The present disclosure relates to shelving supports, and in particular to supports for rack rails.

BACKGROUND

Installing rack equipment on rack rails such as server racks and cabinets can be a challenging task. A particular challenge can be when attempting to install heavier equipment on a four-post rack shelf. Typically, an installer must try to support the rack equipment with one hand while installing the rack equipment with their other hand. Should the hand that is supporting the rack equipment waver due to fatigue, etc., the installation points on the rack equipment become misaligned with the desired holes in the rack rail, and the installer must try again to correctly support the rack equipment with their hand at the desired location. The installer may sometimes be required to take a break before attempting to support/install the rack equipment again in order to allow their arm time to recover from fatigue, etc. The installation process may thus require more time than initially expected, and installers may become frustrated.

Accordingly, an apparatus that facilitates installation of rack equipment on a rack rail remains highly desirable.

BRIEF DESCRIPTION OF THE DRAWINGS

Features and advantages of the present disclosure will become apparent from the following detailed description, taken in combination with the appended drawings, in which:

FIGS. 1C and 1D show a representation of another rack rail support in accordance with the present disclosure;

It will be noted that throughout the appended drawings, like features are identified by like reference numerals.

DETAILED DESCRIPTION

Figures 1A, 1B:
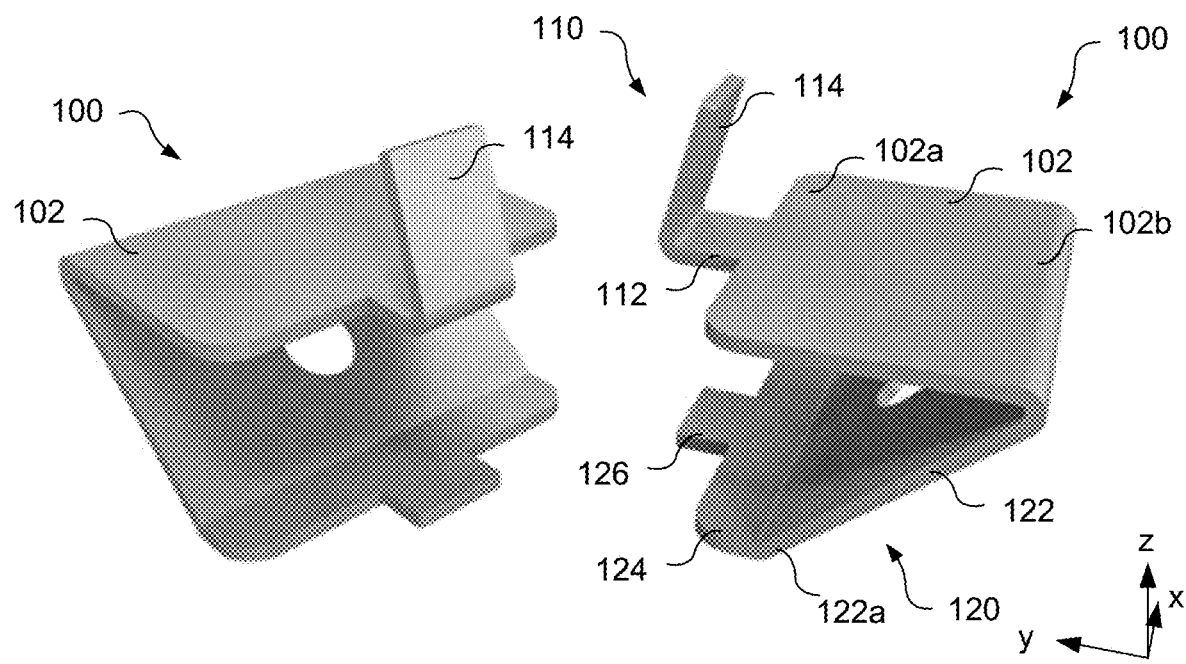
FIGS. 1A and 1B show a representation of a rack rail support in accordance with the present disclosure.

In accordance with one aspect of the disclosure, a rack rail support is disclosed, comprising: a support portion configured to support a portion of rack equipment to be installed on a rack rail; and an engagement portion coupled to a first end of the support portion and configured to be inserted through a first hole in the rack rail and to engage with a first surface of the rack rail.

In some aspects, a support surface of the support portion is generally flat.

In some aspects, a support surface of the support portion is concave.

In some aspects, the support portion comprises one or more edge surfaces extending upwards from a perimeter of the support portion.

In some aspects, the support portion comprises one or more lips on a perimeter thereof.

In some aspects, the engagement portion comprises an engagement member that is angled relative to the support portion and engages with the first surface of the rack rail such that when the engagement member is engaged with the rack rail, the support portion is arranged in a support position and extends from a second surface of the rack rail opposite the first surface.

In some aspects, the engagement member extends upwardly from the support portion at a first angle relative to the support portion.

In some aspects, the first angle between the engagement member and the support portion is between 65 and 85 degrees.

In some aspects, the first angle between the engagement member and the support portion is approximately 75 degrees.

In some aspects, the support portion in the support position extends from the second surface of the rack rail in a generally horizontal direction.

In some aspects, the rack rail support further comprises a securing portion coupled to a second end of the support portion opposite the first end and comprising an angled section that is angled relative to the support portion.

In some aspects, the angled section extends downwardly from the support portion at a second angle relative to the support portion towards the second surface of the rack rail.

In some aspects, the second angle between the angled section and the support portion is greater than 30 degrees.

In some aspects, the securing portion further comprises an insertion member coupled to a distal end of the angled section and configured to be inserted into a second hole in the rack rail below the first hole.

In some aspects, the insertion member is coupled to the distal end via an insertion member coupling section at the distal end of the angled section.

In some aspects, the insertion member coupling section is perpendicular to the second surface of the rack rail when the support portion is in the support position.

In some aspects, the rack rail support further comprises one or more structural members extending between the support portion and the securing portion.

In accordance with another aspect of the present disclosure, a kit is disclosed that comprises a plurality of rack rail supports of any of the above aspects.

In accordance with another aspect of the present disclosure, a method of installing a rack rail support onto a rack rail is disclosed, comprising: inserting an engagement portion of the rack rail support through a first hole in the rack rail, wherein the engagement portion is coupled to a first end of a support portion of the rack rail support that is configured to support a portion of rack equipment to be installed on the rack rail; and engaging the engagement portion of the rack rail support with a first surface of the rack rail.

In some aspects, the engagement portion comprises an engagement member that is angled relative to the support portion, and engaging the engagement portion of the rack rail support with the first surface comprises rotating the rack rail support to engage the engagement member with the first surface of the rack rail, and when the engagement member is engaged with the rack rail, the support portion is arranged in a support position and extends from a second surface of the rack rail opposite the first surface.

In some aspects, the rack rail support further comprises a securing portion coupled to a second end of the support portion opposite the first end, the securing portion comprising an angled section that is angled relative to the support portion and that extends downwardly from the support portion at a second angle relative to the support portion towards the second surface of the rack rail, and an insertion member coupled to a distal end of the angled section and configured to be inserted into a second hole in the rack rail below the first hole, and the method further comprises inserting the insertion member to a second hole of the rack rail below the first hole.

The present disclosure describes a rack rail support that provides an easier way to install shelves and other rack equipment on a rack rail. In accordance with one aspect, the rack rail support comprises a support portion configured to support a portion of rack equipment to be installed on a rack rail, and an engagement portion coupled to a first end of the support portion and configured to be inserted through a first hole in the rack rail and to engage with a first surface of the rack rail. With the engagement portion engaged with the first surface of the rack rail, the support portion is configured to support the portion of rack equipment and thus provides a temporary support that can be used to support the rack equipment for installing onto the rack rail. That is, the rack equipment can be supported by the rack rail support, installed onto the rack rail at one or more holes above the first hole through which the rack rail support is inserted through, and the rack rail support may then be removed.

By using the rack rail supports to provide a temporary support for supporting the rack equipment at a desired position, the installation of the rack equipment onto the rack rail becomes faster and easier, saving installers time and frustration.

In further aspects, the engagement portion comprises an engagement member that is angled relative to the support portion and engages with the first surface of the rack rail, such that when the engagement member is engaged with the rack rail, the support portion is arranged in a support position and extends from a second surface of the rack rail opposite the first surface. The rack rail support may further comprise a securing portion coupled to a second end of the support portion opposite the first end and comprising an angled section that is angled relative to the support portion, the angled section extending downwardly from the support portion at a second angle relative to the support portion towards the second surface of the rack rail, and the securing portion further comprising an insertion member coupled to a distal end of the angled section and configured to be inserted into a second hole in the rack rail below the first hole. The configuration of the securing portion of the rack rail support may further secure the rack rail support onto the rack rail and helps to prevent movement/rotation of the rack rail support on the rack rail.

Embodiments are described below, by way of example only, with reference to FIGS. 1A-5.

FIGS. 1A and 1B show a representation of a rack rail support 100 in accordance with the present disclosure. Specifically, FIGS. 1A and 1B show isometric views from different angles of the rack rail support 100.

The rack rail support 100 comprises a support portion 102 that is configured to support a portion of rack equipment to be installed on a rack rail. As shown in FIG. 1, the support portion 102 may generally extend in an x-y plane, which as described in more detail below is generally perpendicular to a longitudinal direction of the rack rail that the rack rail support is to be installed on, and the support portion 102 may be generally horizontal when installed on a vertically extending rack rail. An upper support surface of the support portion 102 is shown as being a generally flat surface, though other configurations such as a concave surface to support the portion of rack equipment are also possible. Further, the support portion 102 may comprise one or more lips or upwardly extending edge surfaces along a perimeter thereof to help prevent the portion of the rack equipment from sliding off the support portion 102. The support portion 102 is shown as being a generally square or rectangular shape, though other shapes and configurations of the support portion 102 are possible provided that the support portion 102 is configured to support relevant portions of the rack equipment thereon. Specific shapes and configurations of the support portion 102 may be used to support specific types of rack equipment, though it is also apparent that a single shape and configuration of the support portion 102 can support several different types of rack equipment to be installed.

The rack rail support 100 also comprises an engagement portion 110 coupled to a first end 102a of the support portion 102. The engagement portion 110 is configured to be inserted through a first hole in the rack rail and to engage with a first surface of the rack rail, as described in more detail with reference to FIGS. 2A and 2B below. When the engagement portion 110 is engaged with the first surface of the rack rail, the support portion is arranged in a support position to support the portion of rack equipment thereon. In the rack rail support 100 shown in FIGS. 1A and 1B, the engagement portion 110 comprises a through-hole section 112 and an engagement member 114. The engagement member 114 is angled relative to the support portion 102 and is configured to engage with the first surface of the rack rail. Specifically, the engagement member 114 extends upwards (i.e. in a first longitudinal direction (z-direction) of the rack rail support 100) at an angle relative to the support portion 102 in the x-y plane such that it comes in contact with a first surface of the rack rail (in this case, a rear surface of the rack rail). The angle between the engagement member 114 and the support portion 102 is such that when the engagement member 114 is engaged with the rack rail, the support portion 102 is arranged in a support position and extends from a second surface of the rack rail opposite the first surface (i.e. a front surface) and is in a position to support the portion of rack equipment thereon. For example, the support portion 102 may be generally horizontal. The angle between the engagement member 114 and the support portion 102 may be between 65 and 85 degrees, and may in particular be approximately 75 degrees. The engagement member 114 and the support portion 102 are coupled via the through-hole section 112, which is configured to extend through a hole in a rack rail when in use such that the engagement member 114 engages with a first surface of the rack rail and the support portion 102 extends from the second surface of the rack rail.

As also shown in FIGS. 1A and 1B, the rack rail support 100 may further comprise a securing portion 120 coupled to a second end 102b of the support portion 102 opposite the first end 102a. The securing portion 120 comprises an angled section 122 extending downwards from the second end 102b of the support portion 102 (i.e. in a second longitudinal direction (negative z-direction) of the rack rail support 100) opposite the engagement member 114, and is angled relative to the support portion 102 in the x-y plane such that the angled section 122 extends from the second end 102b of the support portion 102 towards the second surface (i.e. the front surface) of the rack rail when the support portion 102 is arranged in the support position. The angle between the angled section 122 and the support portion 102 may be greater than approximately 30 degrees. The securing portion 120 may further comprise an insertion member 126 extending from a distal end 122a of the angled section 122 that is configured to be inserted into a second hole in the rack rail below the first hole. In this manner, the securing portion 120 helps to hold the rack rail support 100 in place when in use by insertion of the insertion member 126 into the second hole. The size and shape of the insertion member 126 may vary, provided that when inserted into the second hole the insertion member 126 helps to prevent, for example, movement and/or rotation of the rack rail support 100. The size and shape of the insertion member 126 may be configured specifically to the types of holes in the rack rails that the rack rail support is to be used in. The insertion member 126 may be coupled to the distal end 122a of the angled section 122 via an insertion member coupling section 124. The insertion member coupling section 124 may be generally horizontal when in use, and arranged perpendicular to the second surface of the rack rail (i.e. the front surface) when the support portion 102 is in the support position.

The rack rail support 100 may be made of a durable material, such as 14 gauge steel, and may be finished in a powder paint finish. Different weight capacities are possible with different thicknesses of metal. In some embodiments, the securing portion 120 may be made of spring steel. Alternatively, the rack rail support 100 may be manufactured from 3D printing or injection molding. FIGS. 1C and 1D show a representation of another rack rail support 100' in accordance with the present disclosure. The rack rail support 100' generally corresponds to the rack rail support 100, though it has a slightly different design in that it further comprises structural members 130 extending between support portion 102' and securing portion 120'. In this example, the rack rail support 100' has been manufactured from injection molding. The rack rail supports 100 and 100' may be designed to be compliant with all relevant codes/standards, such as RoHS (Restriction of Hazardous Substances Directive) and REACH (Registration, Evaluation, Authorisation and Restriction of Chemicals).

Figure 2A:
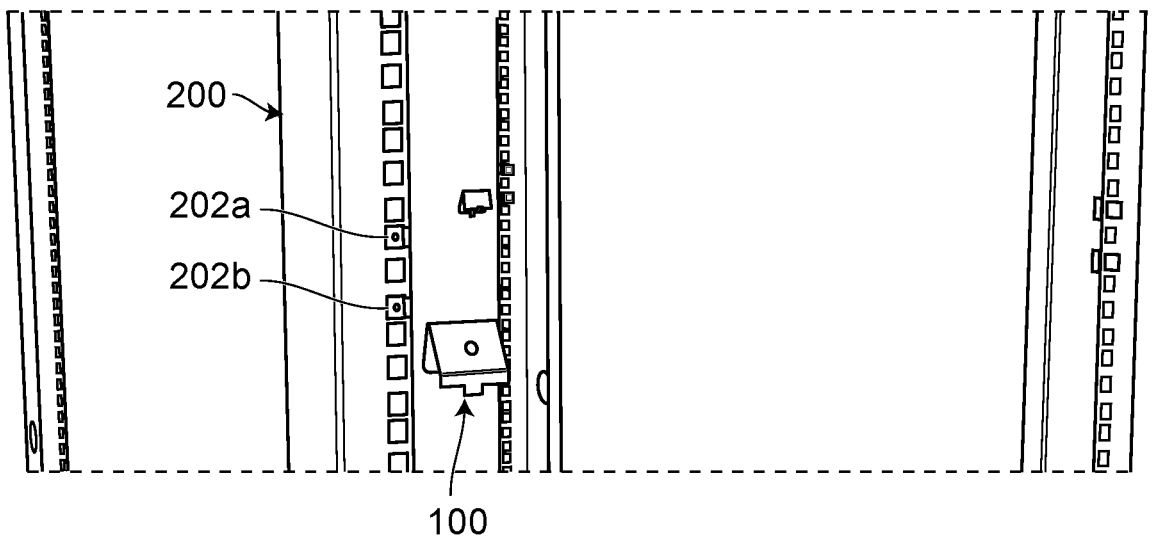
FIGS. 2A and 2B show a representation of four rack rail supports of FIGS. 1A and 1B used in a four post rack shelf.
Figure 2B:
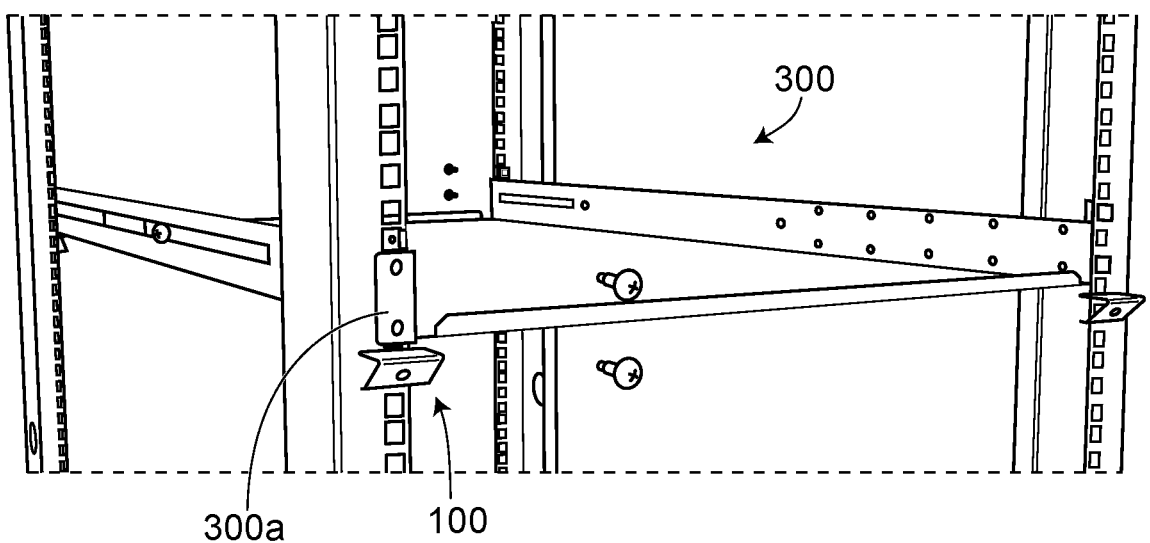

FIGS. 2A and 2B show a representation of four rack rail supports of FIGS. 1A and 1B used in a four post rack shelf comprising rack rails 200. As described, rack rail supports such as rack rail support 100 shown in FIGS. 1A and 1B (and also rack rail support 100' shown in FIGS. 1C and 1D) may be used to provide a temporary support when installing rack equipment. The rack rail supports may be used to support various types of rack equipment, and may be used in a four post rack shelf, two post rack shelf, etc. The rack rail support 100 shown in FIGS. 1A and 1B and rack rail support 100' shown in FIGS. 1C and 1D may be provided as part of a kit comprising a plurality of rack rail supports.

Each rack rail 200 comprises a plurality of holes (e.g. holes 202a, 202b, etc.) that may be used for installing the rack equipment, such as rack equipment 300 shown in FIG. 2B. The rack rail supports (corresponding to rack rail support 100) are engaged with a rack rail by inserting the engagement portion 110 as shown in FIGS. 1A and 1B through a first hole in the rack rail. When the engagement member 114 as shown in FIGS. 1A and 1B has been inserted through the first hole in the rack rail, the rack rail support 100 may be rotated to engage the engagement member 114 with a first surface of the rack rail 200 (i.e. the rear surface in FIGS. 2A and 2B). With the engagement member 114 in contact with the first surface of the rack rail, the support portion 102 shown in FIGS. 1A and 1B is in a configuration to support a portion the rack equipment thereon, as shown in FIG. 2B. For example, the support portion 102 may be substantially horizontal and extend substantially perpendicular from a front surface of the rack rail 200 to support the portion of rack equipment thereon. In FIG. 2B, the rack rail support 100 is shown as supporting mounting ears 300a of the rack equipment 300. The rack rail supports thus provide a temporary support for the rack equipment 300 that facilitates installation of the rack equipment onto the rack rails. The rack rail supports also advantageously provide a tool-free design and the rack rail supports may easily be installed onto the rack rails.

Where the rack rail support 100 comprises the securing portion 120, the securing portion 120 is configured such that when the engagement member 114 is engaged with the rack rail and the support portion 102 is in the support position, the insertion member 126 as shown in FIGS. 1A and 1B is configured to be inserted into a second hole in the rack rail below the first hole.

Figure 3:
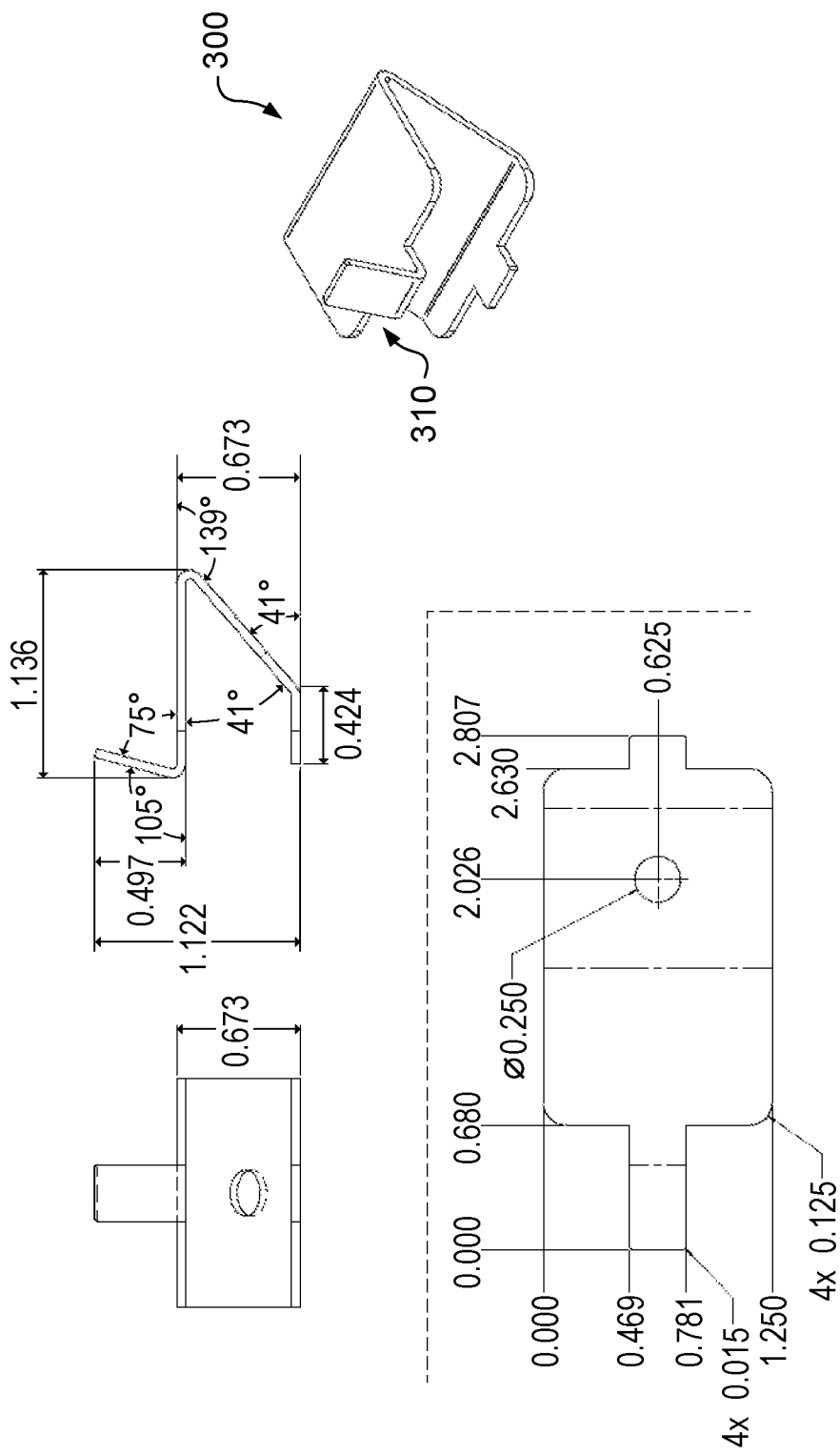
FIG. 3 shows an example of a rack rail support for a rack rail having square holes.
Figure 4:
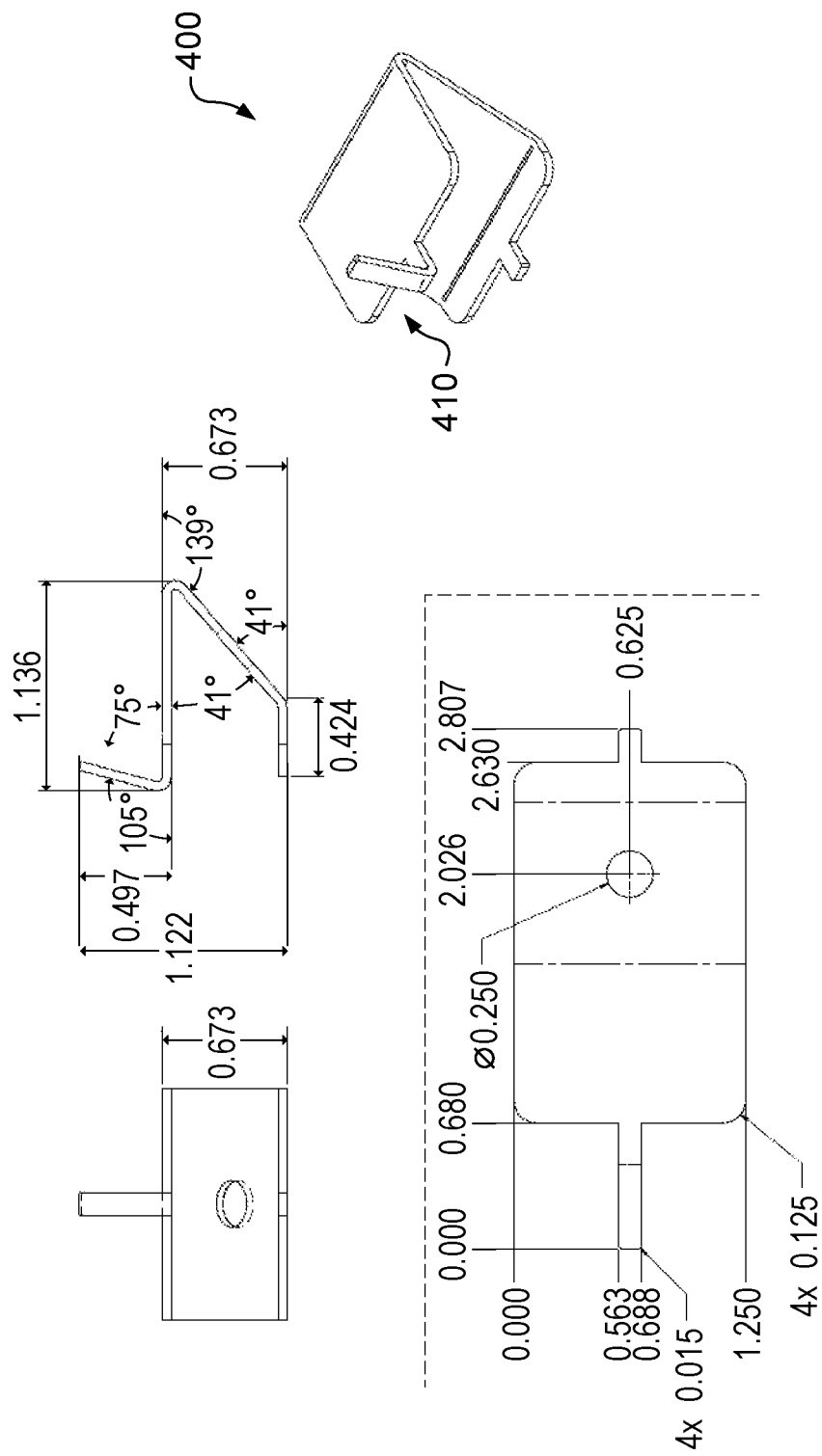
FIG. 4 shows an example of a rack rail support for a rack rail having tapped holes.

The rack rail support 100 and 100' may be designed to fit threaded rail, square, or round hole rails. For example, FIG. 3 shows an example of a rack rail support for a rack rail having square holes, and FIG. 4 shows an example of a rack rail support for a rack rail having tapped holes. As shown in FIGS. 3 and 4, an engagement portion 410 of a rack rail support 400 for a rack rail having tapped holes may be thinner than an engagement portion 310 of a rack rail support 300 for a rack rail having square holes. It will also be appreciated that the detailed drawings shown in FIGS. 3 and 4 are provided for the sake of example only and the dimensions and angles shown in the drawings are non-limiting.

Figure 5:
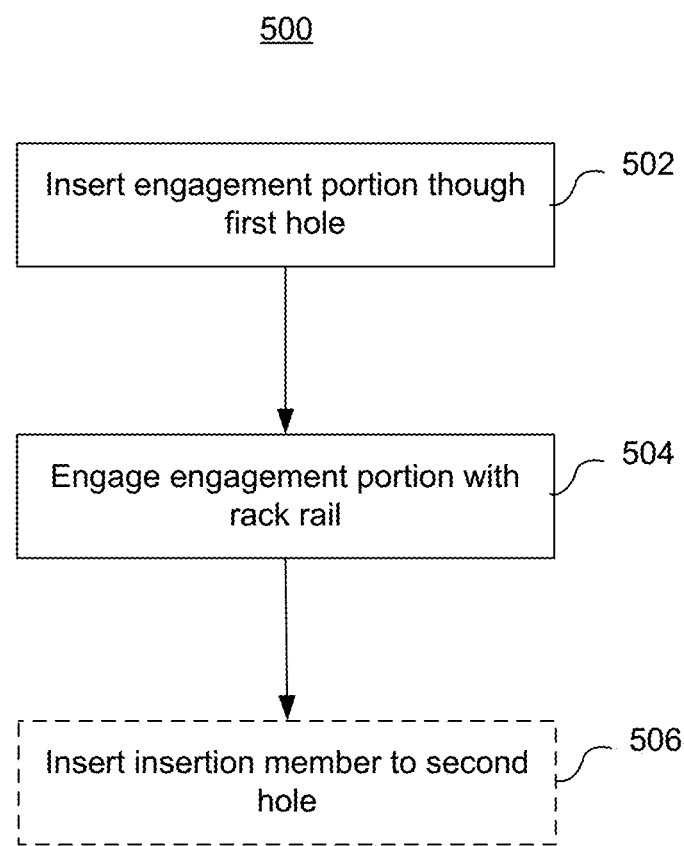
FIG. 5 shows a method of installing a rack rail support onto a rack rail.

FIG. 5 shows a method 500 of installing a rack rail support onto a rack rail. For example, the method 500 may be used to install a rack rail support, such as rack rail support 100, 100', 300, or 400, onto a rack rail. The method comprises inserting an engagement portion of the rack rail support through a first hole in the rack rail (502). As described previously, the engagement portion is coupled to a first end of a support portion of the rack rail support that is configured to support a portion of rack equipment to be installed on the rack rail. The method further comprises engaging the engagement portion of the rack rail support with a first surface of the rack rail (504).

As also described above, the engagement portion may comprise an engagement member that is angled relative to the support portion, and engaging the engagement portion of the rack rail support with the first surface of the rack rail comprises rotating the rack rail support to engage the engagement member with the first surface of the rack rail. When the engagement member is engaged with the rack rail, the support portion is arranged in a support position and extends from a second surface of the rack rail opposite the first surface.

As also described above, the rack rail support may further comprise a securing portion coupled to a second end of the support portion opposite the first end and comprising an angled section that is angled relative to the support portion and that extends downwardly from the support portion at a second angle relative to the support portion towards the second surface of the rack rail, and comprising an insertion member coupled to a distal end of the angled section and configured to be inserted into a second hole in the rack rail below the first hole. The method may further comprise inserting the insertion member to a second hole of the rack rail below the first hole (506).

With the rack rail support installed onto the rack rail, the support portion is configured to support a portion of rack equipment thereon. An installer can thus more easily install the rack equipment onto the rack rail, and subsequently the rack rail support can be removed.

It would be appreciated by one of ordinary skill in the art that the system and components shown in the figures may include components not shown in the drawings. For simplicity and clarity of the illustration, elements in the figures are not necessarily to scale, are only schematic and are non-limiting of the elements structures. It will be apparent to persons skilled in the art that a number of variations and modifications can be made without departing from the scope of the invention as described herein.

The invention claimed is:

1. A removable rack rail support for providing temporary support for rack equipment, comprising:
    a support portion configured to support a portion of rack equipment to be installed on a rack rail;
    an engagement portion configured to be inserted through a first hole in the rack rail and to engage with an inner surface of the rack rail, the engagement portion comprising:
        a through-hole section having a first end thereof coupled to a first end of the support portion such that the through-hole section extends away from a first end of the support portion and, when the engagement portion is engaged with the inner surface of the rack rail, extends through the first hole of the rack rail; and
        an engagement member substantially flat along a longitudinal axis thereof coupled to a second end of the through-hole section opposite to the first end thereof, the engagement member extending upwardly from through-hole section and inclined towards the support portion along the length of the engagement member such that a distal end of the engagement member is configured to engage with the first surface of the rack rail such that, when the engagement portion is engaged with the inner surface of the rack rail, the through-hole section, the engagement member, and the inner surface of the rack rail are arranged in a substantially triangular shape; and
    a securing portion coupled to a second end of the support portion opposite the first end, the securing portion comprising:
        an angled section extending downwardly from the support portion and inclined towards the support portion;
        an insertion member coupling section substantially parallel to the support portion having a distal end thereof configured to engage an outer surface of the rack rail opposite to the inner surface, the insertion member coupling section extending from a distal end of the angled section; and
        an insertion member coupled to the distal end of the insertion member coupling section and configured to be inserted into a second hole in the rack rail below the first hole.

2. The removable rack rail support of claim 1, wherein a support surface of the support portion is generally flat.

3. The removable rack rail support of claim 1, wherein a support surface of the support portion is concave.

4. The removable rack rail support of claim 1, wherein the support portion comprises one or more edge surfaces extending upwards from a perimeter of the support portion.

5. The removable rack rail support of claim 1, wherein the support portion comprises one or more lips on a perimeter thereof.

6. The removable rack rail support of claim 1, wherein the engagement member engages with the inner surface of the rack rail such that when the engagement member is engaged with the rack rail, the support portion is arranged in a support position and extends from the outer surface.

7. The removable rack rail support of claim 1, wherein the engagement member extends upwardly from the through-hole section at a first angle relative to the support portion, and wherein the first angle between the engagement member and the support portion is between 65 and 85 degrees.

8. The removable rack rail support of claim 7, wherein the first angle between the engagement member and the support portion is approximately 75 degrees.

9. The removable rack rail support of claim 6, wherein the support portion in the support position extends from the outer surface of the rack rail in a generally horizontal direction.

10. The removable rack rail support of claim 1, wherein the angled section extends downwardly from the support portion at a second angle relative to the support portion, and wherein the second angle between the angled section and the support portion is greater than 30 degrees.

11. The removable rack rail support of claim 10, wherein the second angle between the angled section and the support portion is between 31 and 51 degrees.

12. The removable rack rail support of claim 6, wherein the insertion member coupling section is perpendicular to the outer surface of the rack rail when the support portion is in the support position.

13. The removable rack rail support of claim 1, further comprising one or more structural members extending between the support portion and the securing portion.

14. A kit, comprising a plurality removable of rack rail supports of claim 1.

15. The removable rack rail support of claim 1, wherein the removable rack rail support is formed from 14 gauge steel.

16. The removable rack rail support of claim 1, wherein the removable rack rail support is formed from spring steel.

17. The removable rack rail support, of claim 1, wherein the removable rack rail support is manufactured using 3D printing or injection molding.

18. The removable rack rail support of claim 1, wherein the through-hole section is substantially perpendicular to the inner surface of the rack rail and substantially parallel to the insertion member when the engagement portion is engaged with the inner surface of the rack rail.

19. The removable rack rail support of claim 1, wherein the insertion member is substantially parallel to the support portion such that the insertion member extends away from the inner surface of the rack rail in a direction substantially perpendicular to the inner surface of the rack rail when the insertion member coupling is engaged with the outer surface of the rack rail.

20. A method of installing a removable rack rail support onto a rack rail to provide temporary support for rack equipment, wherein the removable rack rail support comprises:
    a support portion configured to support a portion of rack equipment to be installed on a rack rail;
    an engagement portion configured to be inserted through a first hole in the rack rail and to engage with an inner surface of the rack rail, the engagement portion comprising:

a through-hole section having a first end thereof coupled to a first end of the support portion such that the through-hole section extends away from a first end of the support portion and, when the engagement portion is engaged with the inner surface of the rack rail, extends through the first hole of the rack rail; and an engagement member substantially flat along a longitudinal axis thereof coupled to a second end of the through-hole section opposite to the first end thereof, the engagement member extending upwardly from through-hole section and inclined towards the support portion along the length of the engagement member such that a distal end of the engagement member is configured to engage with the first surface of the rack rail such that, when the engagement portion is engaged with the inner surface of the rack rail, the through-hole section, the engagement member, and the inner surface of the rack rail are arranged in a substantially triangular shape; and a securing portion coupled to a second end of the support portion opposite the first end, the securing portion comprising:

an angled section extending downwardly from the support portion and inclined towards the support portion;

an insertion member coupling section substantially parallel to the support portion having a distal end thereof configured to engage an outer surface of the rack rail opposite to the inner surface, the insertion member coupling section extending from a distal end of the angled section; and an insertion member coupled to the distal end of the insertion member coupling section and configured to be inserted into a second hole in the rack rail below the first hole, the method comprising:

inserting the engagement member of the removable rack rail support through the first hole in the rack rail, engaging the engagement member of the removable rack rail support with the inner surface of the rack rail such that the distal end of the engagement member is in contact with the inner surface and such that the through-hole section, the engagement member, and the inner surface of the rack rail are arranged in the substantially triangular shape:

inserting the insertion member of the removable rack rail support through the second hole in the rack rail below the first hole;

engaging the insertion member coupling section with the outer surface; and removing the rack rail support from the rack rail when the support is no longer required for the rack equipment.

21. The method of claim 20, wherein engaging the engagement member of the removable rack rail support with the inner surface comprises rotating the removable rack rail support to engage the engagement member with the inner surface of the rack rail, and when the engagement member is engaged with the rack rail, the support portion is arranged in a support position and extends from the outer surface.

* * * * *